(12) United States Patent
Mann et al.

(10) Patent No.: US 10,403,629 B2
(45) Date of Patent: Sep. 3, 2019

(54) SIX-TRANSISTOR (6T) SRAM CELL STRUCTURE

(71) Applicant: GLOBALFOUNDRIES Inc., Grand Cayman (KY)

(72) Inventors: Randy W. Mann, Milton, NY (US); Bipul C. Paul, Mechanicville, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/804,556

(22) Filed: Nov. 6, 2017

(65) Prior Publication Data
US 2019/0139967 A1 May 9, 2019

(51) Int. Cl.
*H01L 27/11* (2006.01)
*H01L 27/092* (2006.01)
(Continued)

(52) U.S. Cl.
CPC ........ *H01L 27/1104* (2013.01); *G11C 11/412* (2013.01); *H01L 27/092* (2013.01); *H01L 2027/11816* (2013.01)

(58) Field of Classification Search
CPC ........... H01L 27/092; H01L 2924/0002; H01L 2924/00; H01L 27/1104; H01L 2027/11874; H01L 21/76895; H01L 21/76897; H01L 21/8221; H01L 21/823431; H01L 21/845; H01L 23/528; H01L 23/5286; H01L 23/5386; H01L 27/0207; H01L 27/0688; H01L 27/088; H01L 27/0886; H01L 27/0924; H01L 27/1116; H01L 27/11807; H01L 27/1211; H01L 29/0649; H01L 29/0673; H01L 29/41725; H01L 29/41741; H01L 29/42392; H01L 29/775; H01L 29/7827;
(Continued)

(56) References Cited

U.S. PATENT DOCUMENTS 8,754,481 B2 6/2014 Masuoka et al.
9,472,558 B1 * 10/2016 Cheng ................. H01L 27/1116
(Continued)

OTHER PUBLICATIONS

Chung et al., "Novel 4F2 DRAM Cell with Vertical Pillar Transistor (VPT)," 2011 IEEE, pp. 211-214.
(Continued)

*Primary Examiner* — Edward Chin
(74) *Attorney, Agent, or Firm* — Amerson Law Firm, PLLC

(57) ABSTRACT

One illustrative 6T SRAM cell structure disclosed herein includes a first active region with a first N-type pass gate transistor, a first N-type pull-down transistor and a first P-type pull-up transistor, each of which are formed in and above the first active region, wherein the first N-type pull-down transistor is positioned laterally between the first N-type pass gate transistor and the first P-type pull-up transistor, and a second active region with a second N-type pass gate transistor, a second N-type pull-down transistor and a second P-type pull-up transistor, each of which are formed in and above the second active region, wherein the second N-type pull-down transistor is positioned laterally between the second N-type pass gate transistor and the second P-type pull-up transistor.

20 Claims, 4 Drawing Sheets

(51) Int. Cl.
  *G11C 11/412* (2006.01)
  *H01L 27/118* (2006.01)
(58) Field of Classification Search
  CPC ............... H01L 29/785; H01L 29/78642;
  11C 11/417
  See application file for complete search history.

(56) References Cited

U.S. PATENT DOCUMENTS

| | | | |
|---|---|---|---|
| 9,871,103 B2* | 1/2018 | Kim | ............... H01L 27/0207 |
| 2004/0061153 A1 | 4/2004 | Misewich et al. | |
| 2004/0113207 A1 | 6/2004 | Hsu et al. | |
| 2005/0186760 A1* | 8/2005 | Hashimura | ............ B23K 26/18 |
| | | | 438/460 |
| 2006/0017119 A1 | 1/2006 | Jln et al. | |
| 2007/0075359 A1 | 4/2007 | Yoon et al. | |
| 2008/0179693 A1 | 7/2008 | Kim et al. | |
| 2008/0203493 A1 | 8/2008 | Yasuda | |
| 2010/0203714 A1 | 8/2010 | Masuoka et al. | |
| 2010/0237419 A1* | 9/2010 | Yang | ................... H01L 27/0207 |
| | | | 257/368 |
| 2014/0003133 A1 | 1/2014 | Lin et al. | |
| 2015/0318288 A1 | 11/2015 | Lim et al. | |
| 2016/0133633 A1* | 5/2016 | Liaw | ..................... H01L 23/528 |
| 2017/0287905 A1* | 10/2017 | Morrow | .......... H01L 21/823431 |

OTHER PUBLICATIONS

Huynh-Bao et al., "Toward the 5nm Technology: Layout Optimization and Performance Benchmark for Logic/SRAMs Using Lateral and Vertical GAA FETs".

Huynh-Bal et al., "A Comprehensive Benchmark and Optimization of 5-nm Lateral and Vertical GAA 6T-SRAMs," IEEE Transactions on Electron Devices, 63:643-51, Feb. 2016.

Sharma et al., "SRAM Design for Wireless Sensor Networks, Chapter 2 SRAM Bit Cell Optimization," Springer, 2013.

Notice of Allowance from related U.S. Appl. No. 15/813,471 dated Jul. 5, 2018.

* cited by examiner

SIX-TRANSISTOR (6T) SRAM CELL STRUCTURE

BACKGROUND OF THE INVENTION

1. Field of the Invention

The present disclosure generally relates to the fabrication of semiconductor devices, and, more particularly, to various novel embodiments of a six-transistor (6T) SRAM (Static Random Access Memory) cell structure.

2. Description of the Related Art

Semiconductor memory devices are in widespread use in many modern integrated circuit (IC) products. In general, memory devices are the means by which electrical information is stored. There are many types of memory devices, e.g., SRAMs (Static Random Access Memory), DRAMs (Dynamic Random Access Memory), ROMs (Read Only Memory), etc., each of which has its own advantages and disadvantages relative to other types of memory devices. For example, SRAMs are typically employed in applications where higher speed and/or reduced power consumption is important, e.g., cache memory of a microprocessor, mobile phones and other mobile consumer products, etc. Millions of such memory devices are typically included in even very basic electronic consumer products. Irrespective of the type of memory device, there is a constant drive in the industry to increase the performance and durability of such memory devices. In typical operations, an electrical charge (HIGH) is stored in the memory device to represent a digital "1", while the absence of such an electrical charge or a relatively low charge (LOW) stored in the device indicates a digital "0". Read/write circuitry is used to access the memory device to store digital information on such a memory device and to determine whether or not a charge is presently stored in the memory device. These read/write cycles typically occur millions of times for a single memory device over its effective lifetime.

FIG. 1 depicts a typical prior art 6T (six-transistor) SRAM memory cell 10 that includes two NMOS pass gate transistors PG1, PG2, two PMOS pull-up transistors PU1, PU2, and two NMOS pull-down transistors PD1, PD2. Each of the PMOS pull-up transistors PU1, PU2 has its gate (14A, 14B, respectively) connected to the gate (16A, 16B, respectively) of a corresponding NMOS pull-down transistor PD1, PD2. The PMOS pull-up transistors PU1, PU2 have their drain regions (D) connected to the drain regions of corresponding NMOS pull-down transistors PD1, PD2 to form inverters having a conventional configuration. The source regions (S) of the PMOS pull-up transistors PU1, PU2 are connected to a high reference potential, typically Vdd. The source regions (S) of the NMOS pull-down transistors PD1, PD2 are connected to a lower reference potential, typically Vss or ground. The PMOS pull-up transistor PUI and the NMOS pull-down transistor PD1 make up a first inverter INV1 of the SRAM cell 10. The PMOS pull-up transistor PU2 and the NMOS pull-down transistor PD2 make up a second inverter INV2 of the SRAM cell 10.

In manufacturing such an SRAM cell 10, a first gate-to-source/drain (GSD) contact structure is formed to cross-couple (or connect) the shared drain regions on the first inverter INV1 with the gate structures of the second inverter INV2, and a second GSD contact structure is formed to cross-couple the shared drain regions of the second inverter INV2 with the gate structures of the first inverter INV1. More specifically, the gate 14A of the PMOS pull-up transistor PUI and the gate 16A of the NMOS pull-down transistor PD1 are cross-coupled (i.e., connected) to the drain regions (D) of the transistors PU2, PD2 of the second inverter at node N2. Similarly, the gate 14B of the PMOS pull-up transistor PU2 and the gate 16B of the NMOS pull-down transistor PD2 are cross-coupled (i.e., connected) to the drain regions (D) of the transistors PU1, PD1 of the first inverter at node N1. Hence, the potential present on the drain regions of the transistors PU1, PD1 (node N1) of the first inverter is applied to the gates of transistors PU2, PD2 of the second inverter and the charge serves to keep the second inverter in an ON or OFF state. The logically opposite potential is present on the drain regions of the transistors PU2, PD2 (node N2) of the second inverter and on the gates of the transistors PU1, PD1 of the first inverter, keeping the first inverter in the complementary OFF or ON state relative to the second inverter. Thus, the latch of the illustrated SRAM cell 10 has two stable states: a first state with a predefined relatively higher potential present on charge storage node N1 and a relatively low potential on charge storage node N2; and a second state with a relatively low potential on charge storage node N1 and the predefined relatively high potential on charge storage node N2. Binary data are recorded by toggling between the two states of the latch. Sufficient charge must be stored on the charge storage node, and thus on the coupled gates of the associated inverter, to unambiguously hold one of the inverters "ON" and unambiguously hold the other of the inverters "OFF", thereby preserving the memory state. The stability of an SRAM cell 10 can be quantified by the margin by which the potential on the charge storage nodes can vary from its nominal value while still keeping the SRAM 10 cell in its original state.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel embodiments of a 6T SRAM cell structure. One illustrative 6T SRAM cell structure disclosed herein includes a first active region with a first N-type pass gate transistor, a first N-type pull-down transistor and a first P-type pull-up transistor, each of which are formed in and above the first active region, wherein the first N-type pull-down transistor is positioned laterally between the first N-type pass gate transistor and the first P-type pull-up transistor, and a second active region with a second N-type pass gate transistor, a second N-type pull-down transistor and a second P-type pull-up transistor, each of which are formed in and above the second active region, wherein the second N-type pull-down transistor is positioned laterally between the second N-type pass gate transistor and the second P-type pull-up transistor.

BRIEF DESCRIPTION OF THE DRAWINGS

The disclosure may be understood by reference to the following description taken in conjunction with the accompanying drawings, in which like reference numerals identify like elements, and in which.

Figure 1:
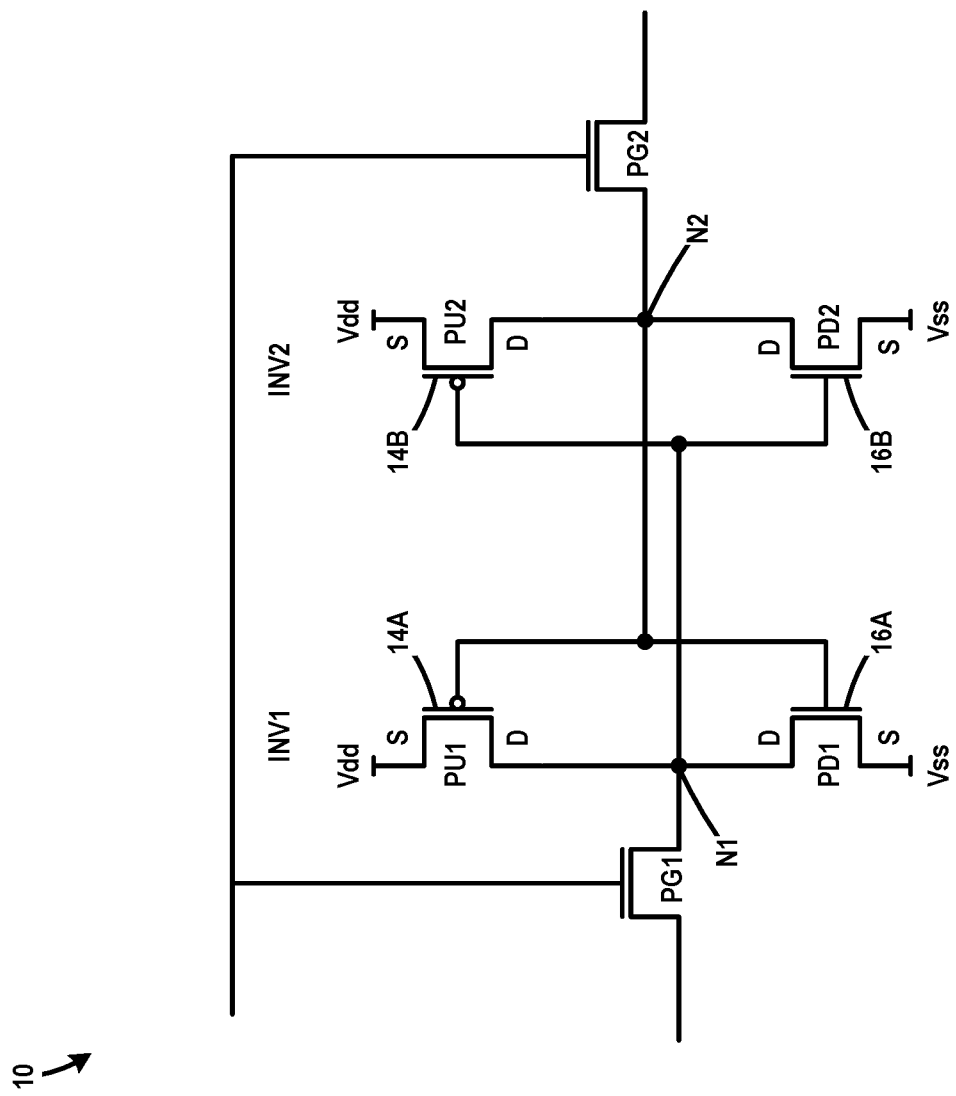
FIG. 1 is an electrical schematic of an illustrative prior art SRAM device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 2:
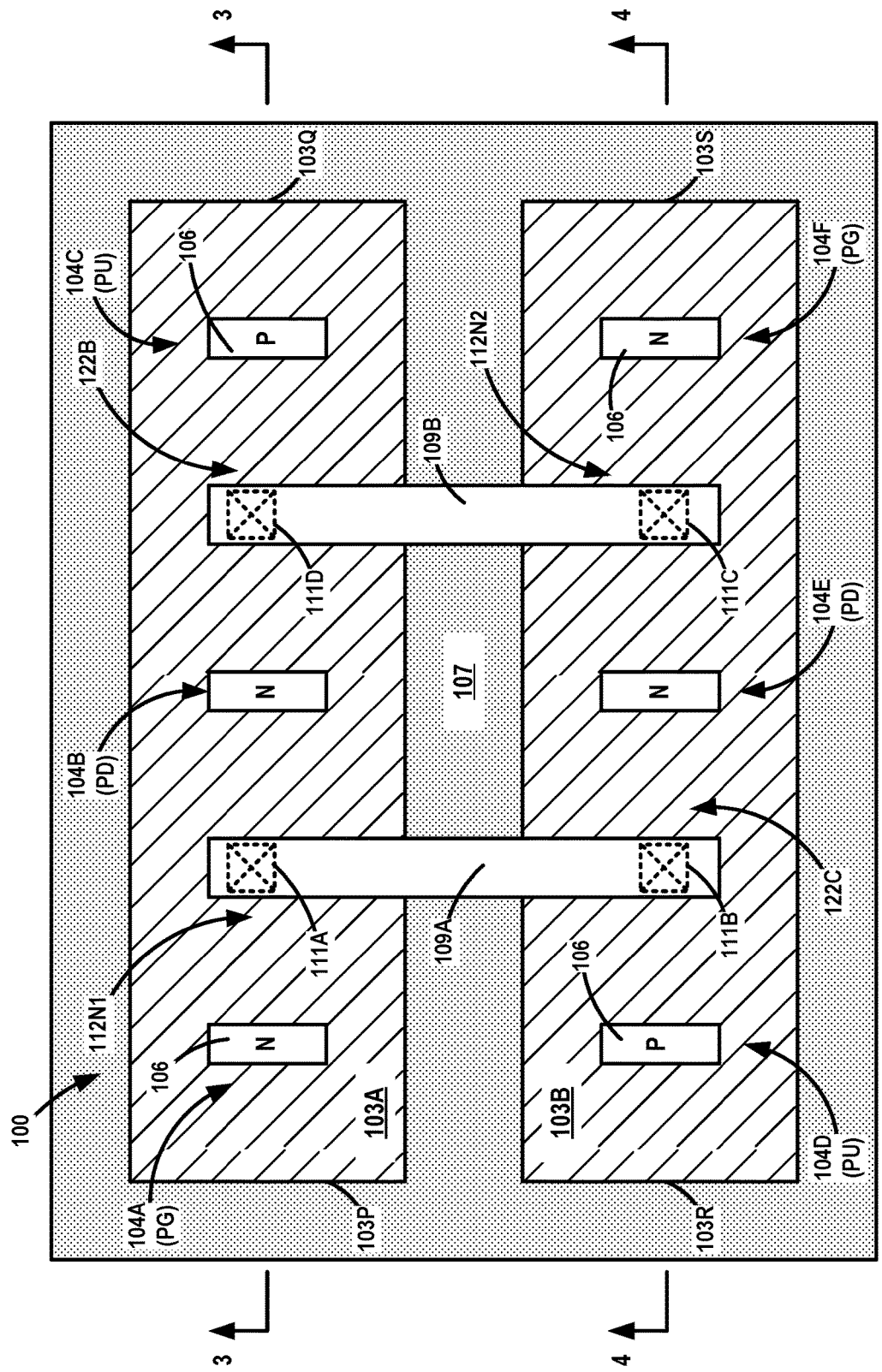
FIG. 2 is a plan view of one illustrative embodiment of a novel 6T SRAM cell structure disclosed herein.

The present disclosure generally relates to various novel embodiments of a 6T SRAM cell structure 100. In the example, the SRAM cell structure 100 will be depicted as including a plurality of illustrative vertical transistor devices. FIG. 2 is a simplistic plan view of one illustrative embodiment of an SRAM cell structure 100 disclosed herein that includes six illustrative and schematically depicted vertical transistor devices 104A-104F (generally referenced using the numeral 104). Each of the transistors 104 includes a simplistically depicted vertically oriented channel semiconductor (VOCS) structure 106.

Figure 3:
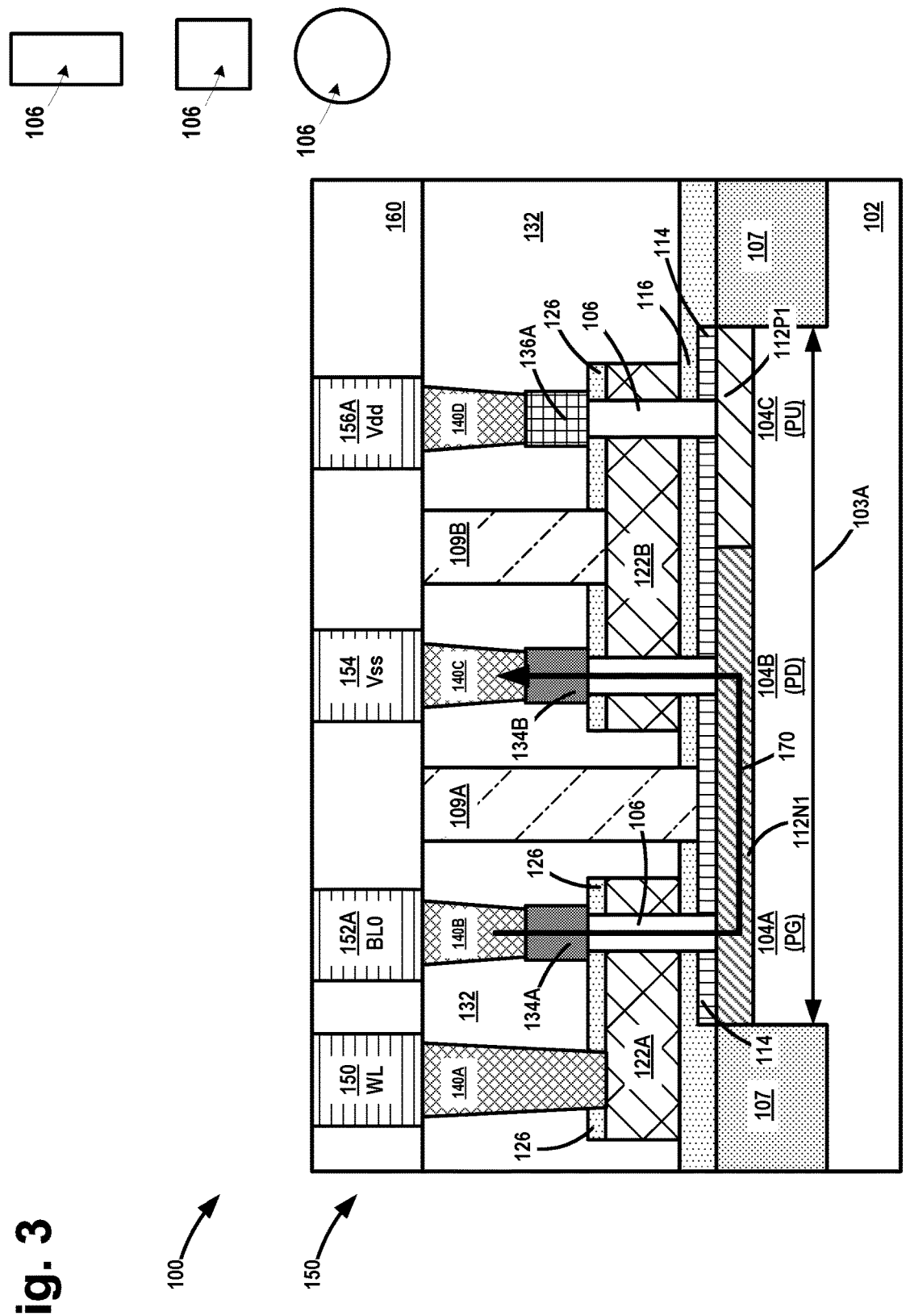
FIGS. 3 and 4 are cross-sectional views taken through the first and second active regions, respectively, of the illustrative embodiment of the novel 6T SRAM cell disclosed in FIG. 2.
Figure 4:
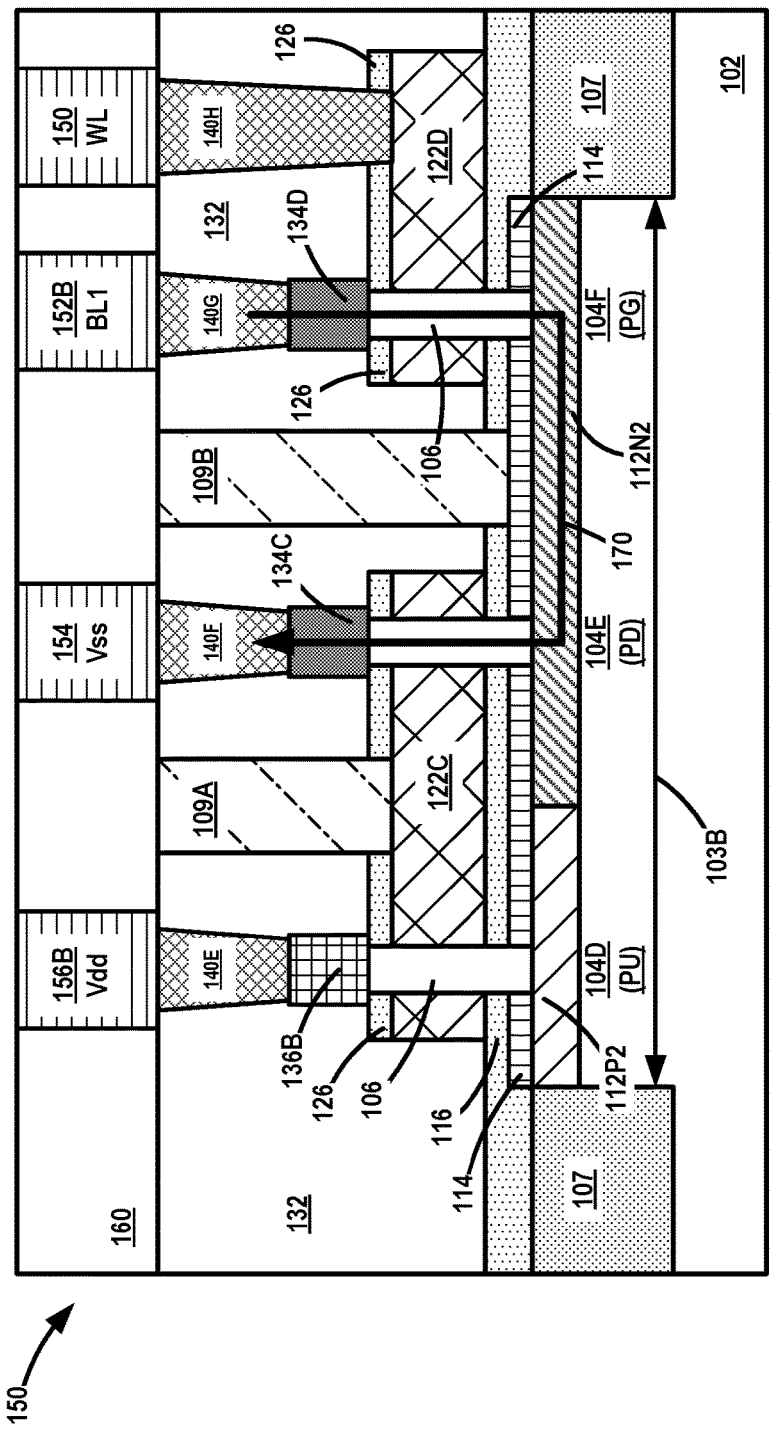

As depicted, the transistors 104A-C and 104D-F are formed in first and second active regions 103A, 103B (generally referenced using the numeral 103), respectively, that are formed in an illustrative semiconductor substrate 102. The substrate 102 may have a variety of configurations, such as the bulk substrate configuration depicted herein or a semiconductor-on-insulator (SOI) configuration. Such an SOI substrate includes a bulk semiconductor layer, a buried insulation layer positioned on the bulk semiconductor layer and an active semiconductor layer positioned on the buried insulation layer, wherein the transistor devices 104 are formed in and above the active layer. The active layer and/or the bulk semiconductor layer may be made of silicon or they may be made of semiconductor materials other than silicon, and they both do not have to be made of the same semiconductor material. Thus, the terms "substrate" or "semiconductor substrate" should be understood to cover all semiconducting materials and all forms of such materials. In one illustrative embodiment, the separate active regions 103A, 103B were formed by etching a plurality trenches in the substrate 102, filling the trenches with an insulating material 107 such as, for example, silicon dioxide, and thereafter performing a chemical mechanical polishing process. As depicted, each of the active regions 103 has a four-sided rectangular configuration (when viewed from above). The length and width dimensions of the active regions 103 may vary depending upon the particular application. FIG. 2 also depicts where the cross-sectional views shown in FIGS. 3 and 4 are taken. More specifically, FIG. 3 is a cross-sectional view taken through the first active region 103A and the transistors 104A, 104B and 104C at the location labeled "3-3", while FIG. 4 is a cross-sectional view taken through the second active region 103B and the transistors 104D, 104E and 104F at the location labeled "4-4."

With reference to FIG. 2, one illustrative embodiment of the novel 6T SRAM cell 100 disclosed herein includes a first N-type pass gate transistor 104A, a first N-type pull-down transistor 104B and a first P-type pull-up transistor 104C, wherein each of the transistors 104A-C are formed in and above the first active region 103A. As indicated, the first N-type pass gate transistor 104A is formed adjacent a first end 103P of the first active region 103A, while the first P-type pull-up transistor 104C is positioned adjacent a second end 103Q of the first active region 103A. The first N-type pull-down transistor 104B is positioned laterally between the first N-type pass gate transistor 104A and the first P-type pull-up transistor 104C.

The illustrative embodiment of the novel 6T SRAM cell 100 shown in FIG. 2 also includes a second P-type pull-up transistor 104D, a second N-type pull-down transistor 104E and a second N-type pass gate transistor 104F, wherein each of the transistors 104D-F are formed in and above the second active region 103B. As indicated, the P-type pull-up transistor 104D is formed adjacent a first end 103R of the second active region 103B, while the second N-type pass gate transistor 104F is positioned adjacent a second end 103S of the second active region 103B. The second N-type pull-down transistor 104E is positioned laterally between the second P-type pull-up transistor 104D and the second N-type pass gate transistor 104F. In one particular embodiment disclosed herein, the first and second active regions 103A, 103B have the same length (lateral direction in FIG. 2) and the same width dimension (vertical direction in FIG. 2), and the active regions 103 are positioned such that the end surfaces 103P, 103Q, respectively, of the first active region 103A are substantially aligned with, respectively, the end surfaces 103R, 103S, respectively, of the second active region 103B.

With continuing reference to the illustrative embodiment of the 6T SRAM cell 100 shown in FIG. 2, the first N-type pass gate transistor 104A, the first N-type pull-down transistor 104B, and the first P-type pull-up transistor 104C, respectively, on the first active region 103A are positioned opposite, respectively, the second P-type pull-up transistor 104D, the second N-type pull-down transistor 104E and the second N-type pass gate transistor 104F on the second active region 103B.

With reference to FIGS. 2-4, the 6T SRAM cell 100 also includes various other regions and structures. For example, the 6T SRAM cell 100 includes a first $N^+$-doped shared source/drain region 112N1 that is shared by the first N-type pass gate transistor 104A and the first N-type pull-down transistor 104B as well as a first shared gate structure 122B that is shared by the first N-type pull-down transistor 104B and the first P-type pull-up transistor 104C. The 6T SRAM cell 100 also includes a second $N^+$-doped shared source/drain region 112N2 that is shared by the second N-type pass gate transistor 104F and the second N-type pull-down transistor 104E as well as a second shared gate structure 122C that is shared by the second N-type pull-down transistor 104E and the second P-type pull-up transistor 104D. The first $N^+$-doped shared source/drain region 112N1, the first shared gate structure 122B, the second $N^+$-doped shared source/drain region 112N2 and the second shared gate structure 122C are not shown in FIG. 2 but labeled arrows indicate the general locations of these regions and structures.

With reference to FIGS. 2-4, the 6T SRAM cell 100 further includes first and second gate-to source/drain (GSD) conductive contact structures 109A, 109B (generally referenced using the numeral 109). The first GSD contact structure 109A is conductively coupled to both the first shared $N^+$-doped source/drain region 112N1 and the second shared gate structure 122C, as indicated by the simplistic and representative contact structures 111A, 111B, respectively. The second gate-to source/drain (GSD) contact structure 109B is conductively coupled to the second shared $N^+$-doped source/drain region 112N2 and the second shared gate structure 122B, as indicated by the simplistic and representative contact structure 111C, 111D, respectively. The contact structures 111A-D are not shown in the cross-sectional drawings (FIGS. 3 and 4) so as not to overly complicate the drawings.

Further aspects of the transistor devices 104 will now be described with more detail with reference to FIGS. 3 and 4. In one embodiment, the substrate 102 may be a $P^-$-doped substrate with an $N^-$-doped well region (not shown) formed in the active regions 103 by performing known masking and ion implantation processes. FIGS. 3 and 4 simplistically depict the illustrative vertical transistors 104 disclosed herein, wherein the components of the transistors 104 may be fabricated using various known manufacturing techniques. In general, each of the transistors 104 comprises a VOCS structure 106, a metal silicide region 114, a bottom spacer 116, a final gate structure 122A-D (collectively referenced using the numeral 122) and a top spacer 126. Each of the N-type transistors comprise an $N^+$-doped bottom source/drain region (112N1 or 112N2) and an $N^+$-doped top source/drain region (134A-D) while each of the P-type transistors comprises a $P^+$-doped bottom source/drain region (112P1, 112P2) and a $P^+$-doped top source/drain region (136A-B). Also depicted in FIGS. 3-4 are various device level conductive contacts 140A-H (collectively referenced using the numeral 140) that are formed in a plurality of layers of insulating material that is collectively shown as a single layer of insulating material 132 so as not to overly complicate the drawings. The GSD contact structures 109A, 109B are also depicted in FIGS. 3 and 4 but, as noted above, the conductive contact structures 111 are not shown in FIG. 3 or 4. Also shown in FIGS. 3 and 4 is a portion of a metallization system 150 that is formed above the SRAM cell 100 wherein various conductive lines and vias in the metallization system are conductively coupled to the transistors 104. The metallization system 150 depicted herein is intended to be representative in nature as it may be representative of conductive lines and vias formed at any level of a metallization system, e.g., M0 or M1/V0, or it may be representative of conductive lines or vias formed in multiple and different layers of a typical multi-level metallization system of an integrated circuit product.

In the illustrated examples, the VOCS structures 106 have a rectangular cross-section when viewed from above. In other embodiments, the VOCS structures 106 may have different cross-sectional shapes as compared to the rectangular shapes depicted herein, such as circle, oval, square, etc., as shown in the upper right-hand portion of FIG. 3. Additionally, in the example depicted in FIG. 2, the VOCS structures 106 are positioned such that the long axis of the VOCS structures 106 runs vertically in the view shown in FIG. 2. However, as will be appreciated by those skilled in the art after a complete reading of the present application, the VOCS structures 106 may be oriented in any direction. For example, the illustrative VOCS structures 106 shown in FIG. 2 could be oriented such that the long axis of the VOCS structures runs horizontally in the view shown in FIG. 2. In other cases, the VOCS structures 106 may be oriented such that the long axis of the VOCS structures 106 are positioned at an angle (e.g., 45 degrees) relative to a horizontal reference line. In one embodiment, the VOCS structures 106 may be formed by performing one or more etching processes through a patterned etch mask (not shown). Thus, the presently disclosed inventions should not be considered to be limited to any particular configuration (when viewed from above) of the VOCS structures 106, any particular orientation of the VOCS structures 106 or the manner in which the VOCS structures 106 are manufactured.

Various ion implantation processes were performed though separate patterned implant masks (not shown) to formed various doped bottom source/drain regions within the N-well region in the active regions 103 for the various transistors 104. More specifically, a first ion implantation process was performed with an N-type dopant to form illustrative first and second bottom $N^+$-doped shared source/drain regions 112N1 (FIG. 3), 112N2 (FIG. 4) in the active regions 103A, 103B, respectively. Thereafter, the first patterned ion implantation mask was removed and a second ion implantation process was performed with a P-type dopant to form illustrative first and second bottom $P^+$-doped source/drain regions 112P1 (FIG. 3), 112P2 (FIG. 4) in the active regions 103A, 103B, respectively. The dopant dose and implant energy used to form the bottom source/drain regions may vary depending upon the particular application. As noted above, and as shown in FIG. 3, the first $N^+$-doped shared source/drain region 112N1 is shared by the first N-type pass gate transistor 104A and the first N-type pull-down transistor 104B. As shown in FIG. 2, the first GSD contact structure 109A is conductively coupled to the $N^+$-doped shared source/drain region 112N1 by the schematically depicted conductive contact 111A. As noted above, and as shown in FIG. 4, the second $N^+$-doped shared source/drain region 112N2 is shared by the second N-type pass gate transistor 104F and the second N-type pull-down transistor 104E. As shown in FIG. 2, the second GSD contact structure 109B is conductively coupled to the second N⁺-doped shared source/drain region 112N2 by the schematically depicted conductive contact 111D. Of course, if desired, the doped bottom source/drain regions may be formed by forming in-situ doped epi semiconductor material on the substrate 102 around the VOCS structures 106.

Then, an etching process was performed through another patterned etch mask (not shown), such as a patterned layer of photoresist, to define an isolation trench that extends into the substrate 102. A layer of insulating material 107, such as silicon dioxide, was then deposited so as to over-fill the remaining space above the trenches and above the upper surface of the patterned etch mask (not shown) positioned above the VOCS structures 106. Thereafter, a CMP process was performed to planarize the upper surface of the deposited layer of insulating material 107 with the upper surface of the patterned etch mask. At that point, a recess etching process was performed to recess the layer of insulating material 107 to the desired level so as to form the depicted isolation structure comprised of the insulating material 107 which laterally bounds each of the active regions 103.

Next, the metal silicide layer 114 was formed on the upper surfaces of the doped bottom source/drain regions 112N1, 112N2, 112P1, 112P2. The metal silicide layer 114 may be formed to any desired thickness, and it may be comprised of any desired material, e.g., cobalt silicide, titanium silicide, etc. Various protective spacers that are formed on the VOCS structures 106 to prevent formation of the metal silicide material during this process are not depicted. The metal silicide material 114 may be formed by depositing a conformal layer of metal, e.g., cobalt, titanium, nickel, etc., and thereafter performing an anneal process. At that point, non-reacted portions of the deposited metal layer may then be removed by etching, followed by the removal of the protective spacers on the sides of the VOCS structures 106. Note that the metal silicide material 114 does not form on the insulating material 107 of the isolation structure. The metal silicide material 114 need not be formed in all applications. When present, the metal silicide material 114 is part of the bottom source/drain regions 112.

Next, a continuous layer of bottom spacer material 116 was formed above the metal silicide material 114 around all of the VOCS structures 106. The continuous layer of bottom spacer material 116 may be formed to any desired thickness, e.g., 4-15 nm, and it may be formed from any desired insulating material, e.g., a low-k insulating material (k value of 7 or less), silicon dioxide, etc. In one embodiment, the continuous layer of bottom spacer material 116 may be formed by performing a deposition process so as to over-fill the trenches with insulating material. Thereafter, the upper surface of the continuous layer of bottom spacer material 116 may be planarized by performing, for example, a CMP process. Then, a timed selective recess etching process may be performed to recess the layer of bottom spacer material 116 to a desired residual thickness. In another embodiment, the continuous layer of bottom spacer material 116 may be formed by performing a directional deposition process, such as a gas cluster ion beam (GCIB) process or an HDP deposition process, to form the continuous layer of bottom spacer material 116 substantially on only the horizontally oriented surfaces of the product 100, e.g., on the upper surface of the metal silicide material 114.

The final gate structures 122 for the various transistor devices 104 are representative in nature and they may be formed using gate-first or replacement-gate manufacturing techniques. In the examples depicted herein, the SRAM cell comprises four gate structures 122A-D. Each of the gate structures 122 comprise a gate insulation layer (not separately shown) and a conductive gate electrode (not separately shown). The gate insulation layer may be comprised of a material such as silicon dioxide or a high-k (k value greater than 10) insulating material. The gate electrode may be comprised of one or more of a variety of different conductive materials, e.g., a metal, a metal alloy, titanium nitride, tantalum nitride, tungsten, aluminum, polysilicon, etc., and it may be formed to any desired thickness.

The N⁺ top source/drain regions 134A-D were formed on the N-type transistors 104A (PG), 104B (PD), 104E (PD) and 104F (PG), respectively. The P⁺ top source/drain regions 136A-B were formed on the P-type transistors 104C (PU) and 104D (PU), respectively. The N-doped top source/drain regions 134 may be formed by performing various operations to remove material so as to expose the upper surface of the VOCS structures 106 of the N-type transistors. Thereafter, an N-doped epi semiconductor material may be formed on the exposed upper surfaces of the VOCS structures 106. A similar process may be performed to form the P-doped top source/drain regions 136.

The device level contacts 140 are intended to be representative in nature as they may be formed of any material and using any technique. In the depicted example, the contact 140A is a gate contact structure that is conductively coupled to the gate structure 122A of the first N-type pass gate transistor 104A; the contact 140B is conductively coupled to the top source/drain region 134A of the first N-type pass gate transistor 104A; the contact 140C is conductively coupled to the top source/drain region 134B of the first N-type pull-down transistor 104B; the contact 140D is conductively coupled to the top source/drain region 136A of the first P-type pull-up transistor 104C; the contact 140E is conductively coupled to the top source/drain region 136B of the second P-type pull-up transistor 104D; the contact 140F is conductively coupled to the top source/drain region 134C of the second N-type pull-down transistor 104E; the contact 140G is conductively coupled to the top source/drain region 134D of the second N-type pass gate transistor 104F; and the contact 140H is a gate contact structure that is conductively coupled to the gate structure 122D of the second N-type pass gate transistor 104F.

As noted above, various conductive structures (e.g., conductive lines and vias) are formed in one or more layers of insulating material of the metallization system 150 so as to establish means by which various electrical signals can be sent to and received from the transistors 104. More specifically, the top source/drain regions 136 of the first and second P-doped P-type pull-up transistors 104C, 104D are connected to a high reference potential, typically Vdd, by separate conductive lines 156A (FIG. 3) and 156B (FIG. 4), respectively. The gate structures 122A and 122D of the first and second N-type pass gate transistors 104A, 104F are coupled to a common conductive structure 150 that will function as a word line in a memory array. The top source/drain region 134A of the first N-type pass gate transistor 104A is conductively coupled to a conductive structure 152A that will function as a separate bit line (e.g., BL0) in a memory array. The top source/drain region 134D of the second N-type pass gate transistor 104F is conductively coupled to a conductive structure 152B that will function as a separate bit line (e.g., BL1) in a memory array. The top source/drain regions 134B, 134C of the N-type pull-down transistors 104B and 104E, respectively, are conductively coupled to a lower reference potential 154, typically Vss or ground.

As will be appreciated by those skilled in the art after a complete reading of the present application, the unique arrangement and positioning of the transistors of the SRAM cell 100 disclosed herein provide significant advantages as it relates to prior art SRAM cells. In general, as it relates to the performance capabilities of any SRAM memory cell and a memory array that comprises thousands of such SRAM memory cells, one important operational parameter is the read current ($I_{read}$) of the cell. The read current is the current flow between the N-type pass gate transistor and the N-type pull-down transistor that flows when an appropriate voltage is applied to a source/drain region of the N-type pass gate transistor (via a bit line) and a source/drain region of the N-type pull-down transistor is coupled to a relatively low voltage (Vss or ground). During "read" operations, the voltage drop differential between BL0 and BL1 caused by the read current must be large enough to be detected by a sense amplifier. In a typical prior art SRAM cell, the P-type pull-up transistor is positioned laterally between the N-type pass gate transistor and the N-type pull-down transistor. This follows from the commonly used cell designs in planar and FinFET technologies.

In contrast to the relative positioning of the transistors on a prior art 6T SRAM cell, in the SRAM cell 100 disclosed herein, the N-type pull-down transistor 104B is positioned laterally between the first N-type pass gate transistor 104A and the first P-type pull-up transistor 104C on the on the first active region 103A, while the second N-type pull-down transistor 104E is positioned laterally between the second P-type pull-up transistor 104D and the second N-type pass gate transistor 104F on the second active region 103B.

The path of the read current 170 in the novel SRAM cell 100 disclosed herein is shown in FIGS. 3 and 4. The read current 170 flows directly through the shared N-doped bottom source/drain regions (112N1, 112N2) of the N-type transistors that are positioned immediately adjacent one another in the novel SRAM cell 100 disclosed herein. The unique arrangement of the transistors on the novel SRAM cell 100 disclosed herein provide several advantages as compared to the prior art SRAM cells disclosed above. First, the provision of the four-sided, rectangular active region 103 makes the fabrication of the product easier as compared to prior products wherein the active regions may have an irregular, non-rectangular active region, such as an L-shaped active region. In the prior art SRAM cell design discussed above, the read current must travel a relatively longer physical path that has a relatively higher resistance as compared to the path the read current 170 takes in the novel SRAM cell 100 disclosed herein. In such a prior art SRAM cell, the read current flowed through the N-doped bottom source/drain region of the N-type pass gate transistor, and either (1) into the N-well region located under the P-doped bottom source/drain region of the P-type pull-up transistor or (2) through the metal silicide region positioned above the P-doped bottom source/drain region of the P-type pull-up transistor where it ultimately flowed through the N-doped bottom source/drain region of the N-type pull-down transistor. When the current path 170 must flow into and out of the silicide material 114, there is an associated contact resistance that degrades the read current and introduces variability. Relative to the relatively physically shorter and lower resistance path for the read current 170 for SRAM cell 100 disclosed herein, the prior art path for the read current tends to degrade the read current and variation in the read current. More specifically, in the prior art SRAM cells, the read current was degraded either by the resistance of the N-well or by the resistance of the metal silicide, depending upon the path taken by the read current. Thus, the novel SRAM cell 100 disclosed herein may provide SRAM cells with improved read current as compared to prior art designs. After a complete reading of the present application, those skilled in the art will appreciate other beneficial aspects of the novel SRAM cell 100 disclosed herein.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A 6T SRAM cell, comprising:
   a first doped contiguous active region in a semiconductor substrate;
   a first N-type pass gate transistor, a first N-type pull-down transistor and a first P-type pull-up transistor, each of which has a bottom source/drain region formed in said first doped contiguous active region, wherein said first N-type pull-down transistor is positioned laterally between said first N-type pass gate transistor and said first P-type pull-up transistor;
   a second doped contiguous active region in the semiconductor substrate adjacent to the first doped contiguous active region; and
   a second N-type pass gate transistor, a second N-type pull-down transistor and a second P-type pull-up transistor, each of which has a bottom source/drain region formed in said second doped contiguous active region, wherein said second N-type pull-down transistor is positioned laterally between said second N-type pass gate transistor and said second P-type pull-up transistor.

2. The 6T SRAM cell of claim 1, wherein said first and second doped contiguous active regions have a four-sided rectangular shape when viewed from above.

3. The 6T SRAM cell of claim 2, and wherein said first and second doped contiguous active regions have a same length and a same width dimension.

4. The 6T SRAM cell of claim 1, wherein each of said first N-type pass gate transistor, said first N-type pull-down transistor, said first P-type pull-up transistor, said second N-type pass gate transistor, said second N-type pull-down transistor and said second P-type pull-up transistor are vertical transistor devices.

5. The 6T SRAM cell of claim 1, wherein said first N-type pass gate transistor, said first N-type pull-down transistor and said first P-type pull-up transistor on said first active region are positioned opposite, respectively, said second P-type pull-up transistor, said second N-type pull-down transistor and said second N-type pass gate transistor on said second active region.

6. The 6T SRAM cell of claim 1, further comprising:
a first N-doped shared source/drain region in said first doped contiguous active region that is shared by said bottom source/drain regions of said first N-type pass gate transistor and said first N-type pull-down transistor;
a first shared gate structure that is shared by said first N-type pull-down transistor and said first P-type pull-up transistor;
a second N-doped shared source/drain region in said second doped contiguous active region that is shared by said bottom source/drain region of said second N-type pass gate transistor and said second N-type pull-down transistor;
a second shared gate structure that is shared by said second N-type pull-down transistor and said second P-type pull-up transistor;
a first gate-to-source/drain (GSD) contact structure that conductively couples said first shared N-doped source/drain region with said second shared gate structure; and
a second gate-to-source/drain (GSD) contact structure that conductively couples said second shared N-doped source/drain region with said first shared gate structure.

7. A 6T SRAM cell, comprising:
a first doped contiguous active region in a semiconductor substrate;
a second doped contiguous active region in the semiconductor substrate adjacent to the first doped contiguous active region;
a first N-type pass gate transistor, a first N-type pull-down transistor and a first P-type pull-up transistor, each of which has a bottom source/drain region formed in said first doped contiguous active region, wherein said first N-type pull-down transistor is positioned laterally between said first N-type pass gate transistor and said first P-type pull-up transistor;
a second N-type pass gate transistor, a second N-type pull-down transistor and a second P-type pull-up transistor, each of which has a bottom source/drain region formed in said second doped contiguous active region, wherein said second N-type pull-down transistor is positioned laterally between said second N-type pass gate transistor and said second P-type pull-up transistor, wherein said first N-type pass gate transistor, said first N-type pull-down transistor and said first P-type pull-up transistor on said first doped contiguous active region are positioned opposite, respectively, said second P-type pull-up transistor, said second N-type pull-down transistor and said second N-type pass gate transistor on said second doped contiguous active region.

8. The 6T SRAM cell of claim 7, further comprising:
a first N-doped shared source/drain region in said first doped contiguous active region that is shared by said bottom source/drain regions of said first N-type pass gate transistor and said first N-type pull-down transistor;
a first shared gate structure that is shared by said first N-type pull-down transistor and said first P-type pull-up transistor;
a second N-doped shared source/drain region in said second doped contiguous active region that is shared by said bottom source/drain regions of said second N-type pass gate transistor and said second N-type pull-down transistor;
a second shared gate structure that is shared by said second N-type pull-down transistor and said second P-type pull-up transistor;
a first gate-to-source/drain (GSD) contact structure that conductively couples said first shared N-doped source/drain region with said second shared gate structure; and
a second gate-to-source/drain (GSD) contact structure that conductively couples said second shared N-doped source/drain region with said first shared gate structure.

9. The 6T SRAM cell of claim 8, wherein said first and second doped contiguous active regions have a four-sided rectangular shape when viewed from above.

10. The 6T SRAM cell of claim 8, and wherein said first and second doped contiguous active regions have a same length and a same width dimension.

11. A 6T SRAM cell, comprising:
a first doped contiguous active region in a semiconductor substrate;
a second doped contiguous active region in the semiconductor substrate adjacent to the first doped contiguous active region;
a first N-type pass gate transistor, a first N-type pull-down transistor and a first P-type pull-up transistor, each of which has a bottom source/drain region formed in said first doped contiguous active region, wherein said first N-type pull-down transistor is positioned laterally between said first N-type pass gate transistor and said first P-type pull-up transistor;
a second N-type pass gate transistor, a second N-type pull-down transistor and a second P-type pull-up transistor, each of which has a bottom source/drain region formed in said second doped contiguous active region, wherein said second N-type pull-down transistor is positioned laterally between said second N-type pass gate transistor and said second P-type pull-up transistor, wherein said first N-type pass gate transistor, said first N-type pull-down transistor and said first P-type pull-up transistor on said first doped contiguous active region are positioned opposite, respectively, said second P-type pull-up transistor, said second N-type pull-down transistor and said second N-type pass gate transistor on said second doped contiguous active region;
a first N-doped shared source/drain region in said first doped contiguous active region that is shared by said bottom source/drain regions of said first N-type pass gate transistor and said first N-type pull-down transistor;
a first shared gate structure that is shared by said first N-type pull-down transistor and said first P-type pull-up transistor;
a second N-doped shared source/drain region in said second doped contiguous active region that is shared by said second bottom source/drain regions of said N-type pass gate transistor and said second N-type pull-down transistor;
a second shared gate structure that is shared by said second N-type pull-down transistor and said second P-type pull-up transistor;
a first gate-to-source/drain (GSD) contact structure that conductively couples said first shared N-doped source/drain region with said second shared gate structure; and a second gate-to-source/drain (GSD) contact structure that conductively couples said second shared N-doped source/drain region with said first shared gate structure.

12. The 6T SRAM cell of claim 11, wherein said first and second doped contiguous active regions have a four-sided rectangular shape when viewed from above.

13. The 6T SRAM cell of claim 12, wherein said first and second doped contiguous active regions have a same length and a same width dimension.

14. The 6T SRAM cell of claim 1, wherein said first N-type pass gate transistor, said first N-type pull-down transistor, and said first P-type pull-up transistor comprise vertical transistors, each having a bottom source/drain region positioned in said first doped contiguous active region, and said second N-type pass gate transistor, said second N-type pull-down transistor, and said second P-type pull-up transistor comprise vertical transistors, each having a bottom source/drain region positioned in said second doped contiguous active region.

15. The 6T SRAM cell of claim 14, wherein said first doped contiguous active region comprises a first N-doped region immediately adjacent and contacting a first P-doped region, said bottom/source drain regions of said first N-type pass gate transistor and said first N-type pull-down transistor are positioned in said first N-doped region, said bottom source/drain region of said first P-type pull-up transistor is positioned in said first P-doped region, said second doped contiguous active region comprises a second N-doped region immediately adjacent and contacting a second P-doped region, said bottom/source drain regions of said second N-type pass gate transistor and said second N-type pull-down transistor are positioned in said second N-doped region, and said bottom source/drain region of said second P-type pull-up transistor is positioned in said second P-doped region.

16. The 6T SRAM cell of claim 15, further comprising:
a first metal silicide layer positioned on a top surface of said first N-doped region and said first P-doped region; and
a second metal silicide layer positioned on a top surface of said second N-doped region and said second P-doped region.

17. The 6T SRAM cell of claim 8, wherein said first N-type pass gate transistor, said first N-type pull-down transistor, and said first P-type pull-up transistor comprise vertical transistors, each having a bottom source/drain region positioned in said first doped contiguous active region, and said second N-type pass gate transistor, said second N-type pull-down transistor, and said second P-type pull-up transistor comprise vertical transistors, each having a bottom source/drain region positioned in said second doped contiguous active region.

18. The 6T SRAM cell of claim 17, wherein said first doped contiguous active region comprises a first N-doped region immediately adjacent and contacting a first P-doped region, said bottom/source drain regions of said first N-type pass gate transistor and said first N-type pull-down transistor are positioned in said first N-doped region, said bottom source/drain region of said first P-type pull-up transistor is positioned in said first P-doped region, said second doped contiguous active region comprises a second N-doped region immediately adjacent and contacting a second P-doped region, said bottom/source drain regions of said second N-type pass gate transistor and said second N-type pull-down transistor are positioned in said second N-doped region, and said bottom source/drain region of said second P-type pull-up transistor is positioned in said second P-doped region.

19. The 6T SRAM cell of claim 18, further comprising:
a first metal silicide layer positioned on a top surface of said first N-doped region and said first P-doped region; and
a second metal silicide layer positioned on a top surface of said second N-doped region and said second P-doped region.

20. The 6T SRAM cell of claim 11, further comprising:
a first P-doped source/drain region of said first P-type pull-up transistor;
a first metal silicide layer positioned on a top surface of said first N-doped shared source/drain region and said first P-doped source/drain region;
a second P-doped source/drain region of said second P-type pull-up transistor; and
a second metal silicide layer positioned on a top surface of said second N-doped shared source/drain region and said second P-doped source/drain region.

* * * * *